United States Patent
Xu et al.

(10) Patent No.: US 7,268,052 B1
(45) Date of Patent: Sep. 11, 2007

(54) METHOD FOR REDUCING SOFT ERROR RATES OF MEMORY CELLS

(75) Inventors: Yanzhong Xu, Santa Clara, CA (US); Oliver Pohland, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 437 days.

(21) Appl. No.: 10/936,275

(22) Filed: Sep. 8, 2004

Related U.S. Application Data

(60) Provisional application No. 60/505,702, filed on Sep. 24, 2003.

(51) Int. Cl.
*H01L 21/20* (2006.01)
(52) U.S. Cl. .................. 438/381; 438/238; 438/251; 438/505; 257/E21; 257/561; 257/632; 257/646; 257/661
(58) Field of Classification Search ............... 438/381, 438/238, 251, 287, 301, 311, 418, 419, 420, 438/433, 356, 447, 505
See application file for complete search history.

(56) References Cited

U.S. PATENT DOCUMENTS

| 5,013,671 | A | * | 5/1991 | Havemann | 438/374 |
|---|---|---|---|---|---|
| 5,132,235 | A | * | 7/1992 | Williams et al. | 438/294 |
| 5,330,922 | A | * | 7/1994 | Erdeljac et al. | 438/207 |
| 6,117,716 | A | * | 9/2000 | Manning | 438/202 |
| 6,660,605 | B1 | * | 12/2003 | Liu | 438/307 |
| 6,670,682 | B1 | * | 12/2003 | Mouli | 257/385 |

OTHER PUBLICATIONS

RAM Reliability: Soft Errors, Apr. 14, 1998, pp. 1-3, [retrieved on Sep. 19, 2003], retrieved from the internet: URL:http://www.crystallineconcepts.com/ram/ram-soft.html/.

* cited by examiner

*Primary Examiner*—David Nhu
(74) *Attorney, Agent, or Firm*—Okamoto & Benedicto LLP

(57) ABSTRACT

In one embodiment, a method of fabricating a transistor for a memory cell includes the steps of performing a counter doping implant before or after a source/drain implant. The counter doping implant may comprise one or more implant steps that move a metallurgical junction formed by a well and a highly doped region closer to a surface of the substrate. The counter doping implant may also increase the concentration of the dopant of the well. The counter doping implant and the source/drain implant may be performed using the same mask. Transistors fabricated using embodiments of the present invention may be employed in memory cells to reduce soft error rates.

10 Claims, 2 Drawing Sheets

METHOD FOR REDUCING SOFT ERROR RATES OF MEMORY CELLS

REFERENCE TO RELATED APPLICATION

This application claims the benefit of U.S. Provisional Application No. 60/505,702, entitled "Method For Improving Soft Error Rates Of Memory Cells," filed on Sep. 24, 2003 by Yanzhong Xu and Oliver Pohland.

BACKGROUND OF THE INVENTION

1. Field of the Invention

The present invention relates generally to integrated circuits, and more particularly to integrated circuit fabrication processes and structures.

2. Description of the Background Art

In the context of memory devices, such as static random access memory (SRAM), a "soft error" is a non-permanent memory error. Most soft errors may be fixed by simply writing new data to the memory. It is well known that alpha particles can cause soft errors. This phenomenon is further described with reference to FIG. 1.

FIG. 1 shows a schematic diagram of a cross-section of a substrate having a P-type metal oxide semiconductor (PMOS) transistor and an N-type metal oxide semiconductor (NMOS) transistor. The PMOS and NMOS transistors are formed in an N-well 103 and a P-well 106, respectively. In the example of FIG. 1, the highly doped region labeled as 104 represents P+ doped regions of the PMOS transistor, such as source and drain regions. The P+/N-well junction is labeled as 105. Similarly, the highly doped region labeled as 107 represents N+ doped regions of the NMOS transistor, such as source and drain regions. The N+/P-well junction is labeled as 108. For clarity of illustration, FIG. 1 does not show all the regions and structures of the transistors.

When an alpha particle hits the silicon area of the NMOS transistor, for example, electron-hole pairs are generated along the trajectory of the particle. The generated carriers can be collected by the biased N+/P-well junction 108, thereby flipping the state of the transistor and causing a soft error. Soft errors due to alpha particles become more significant as device geometries shrink. Unfortunately, conventional techniques for dealing with soft errors, such as implementation of well engineering, use of an N+ or P+ buried layer, or use of an epitaxial wafer, are relatively expensive to implement and are not effective enough in some applications.

SUMMARY

In one embodiment, a method of fabricating a transistor for a memory cell includes the steps of performing a counter doping implant before or after a source/drain implant. The counter doping implant may comprise one or more implant steps that move a metallurgical junction formed by a well and a highly doped region closer to a surface of the substrate. The counter doping implant may also increase the concentration of the dopant of the well. The counter doping implant and the source/drain implant may be performed using the same mask. Transistors fabricated using embodiments of the present invention may be employed in memory cells to reduce soft error rates.

These and other features of the present invention will be readily apparent to persons of ordinary skill in the art upon reading the entirety of this disclosure, which includes the accompanying drawings and claims.

DETAILED DESCRIPTION

In the present disclosure, numerous specific details are provided, such as examples of apparatus, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In one embodiment, memory soft error rates are reduced by counter doping the N+/P-well junction of an NMOS transistor. The counter-doping implant may comprise a single implant step. The counter doping implant may also comprise multiple implant steps to prevent excessive increase of junction capacitance, which may result in losing contact to the N-well and degradation of junction breakdown voltage.

In one embodiment, the counter doping implant is performed in conjunction with the source/drain implant. For example, the counter doping implant may be performed right before or after the source/drain implant. As can be appreciated, this allows the counter doping implant to be performed without additional masking steps and without raising significant integration issues. In one embodiment where a boron P-well implant has a concentration of about $1 \times 10^{17}/cm^3$ and an energy of about 100 to 150 KeV (kilo-electron Volts) for the well implant, an arsenic N-channel implant has a concentration of about $0.2-3 \times 10^{17}/cm^{-3}$ and an energy of about 60 KeV, and an arsenic source/drain implant has a concentration of about $5 \times 10^{19}/cm^3$ and an energy of about 20 to 60 KeV, the counter doping implant performed after the source/drain implant may be a boron implant having a concentration of about $5 \times 10^{17}/cm^3$ and an energy of about 20 to 60 KeV.

Without being limited by theory, the inventors believe that the counter doping implant helps reduce soft errors by increasing the critical charge by increasing the N+/P-well junction capacitance, and by decreasing the funnel length to decrease the amount of carriers collected by a reversed bias N+/P-well junction.

Figure 2:
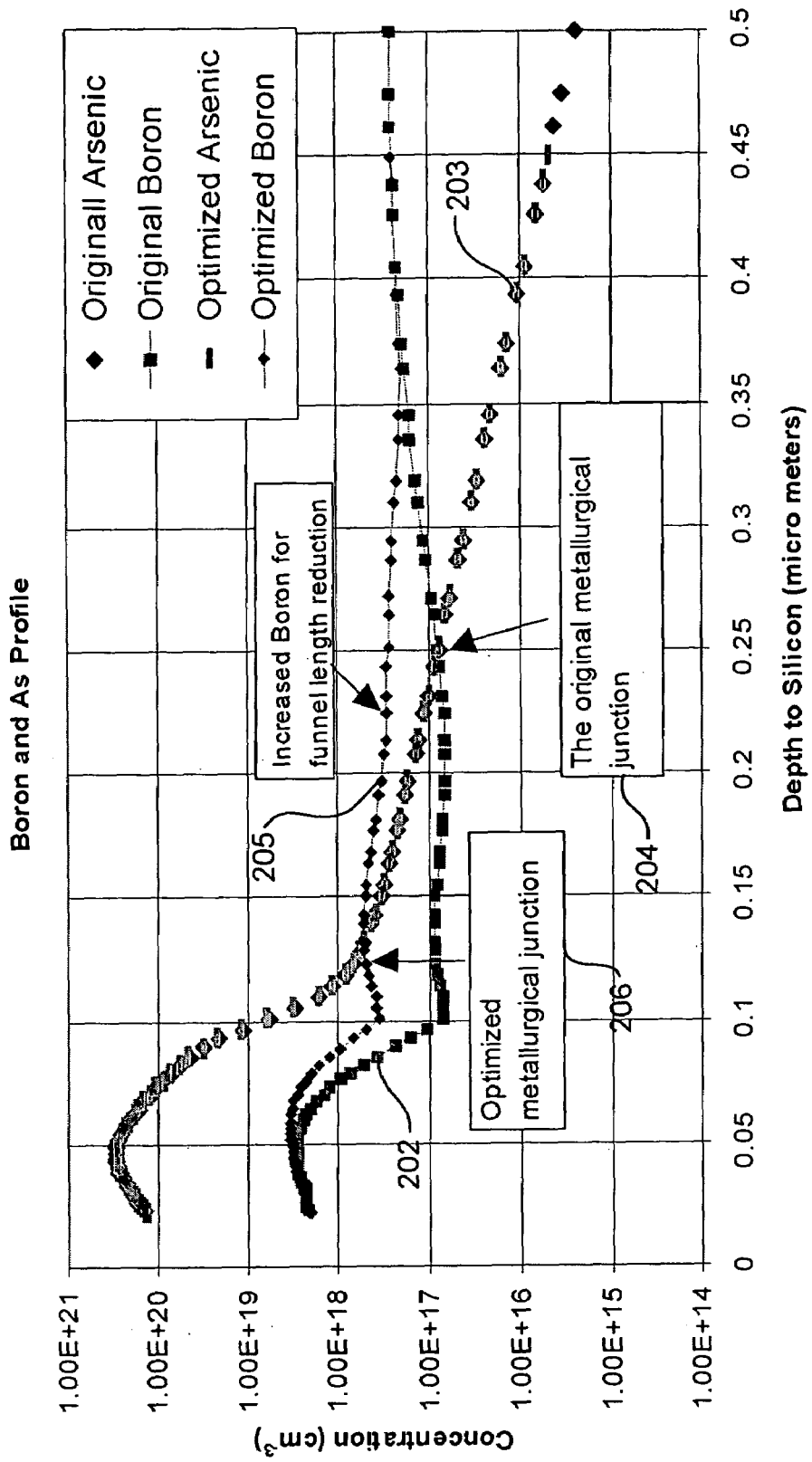
FIG. 2 is a graphical illustration of doping profiles in accordance with an embodiment of the present invention.

FIG. 2 is a graphical illustration of doping profiles in accordance with an embodiment of the present invention. In the example of FIG. 2, the doping profiles are for boron and arsenic implants for an NMOS transistor. In the example of FIG. 2, the vertical axis represents dopant concentration (in $cm^{-3}$), while the horizontal axis represents the depth of the dopant (in μm) from the surface of the substrate, which is a silicon substrate in this embodiment. Plot 203 is due to the arsenic source/drain implant (also referred to as "original arsenic" in FIG. 2) and plot 202 is due to the boron P-well implant (also referred to as "original boron" in FIG. 2). The source/drain implant and the P-well implant result in an N+/P-well junction (also referred to as "original metllaurgical junction in FIG. 2) pointed to by text box 204. Note that both the "original arsenic" and "optimized arsenic" are on the same plot 203 because no arsenic counter doping is performed as this example is for an NMOS transistor. That is, the source/drain implant is the only arsenic or N-type implant in the example of FIG. 2.

Plot 205 is due to a boron counter doping implant (also referred to as "optimized boron" in FIG. 2) and the original boron P-well implant. The boron counter doping results in a new N+/P-well junction (also labeled as "optimized metallurgical junction in FIG. 2) pointed to by text box 206. The boron counter doping increased the boron concentration and moved the N+/P-well junction closer to the surface of the silicon substrate. The higher doping concentration on both sides of the N+/P-well junction and the shallower metallurgical junction increase the N+/P-well junction capacitance. Furthermore, the increase in boron doping concentration beneath the N+/P-well junction effectively reduces the funnel length of collected carriers. These advantageously result in a transistor that may be employed in memory cells for reduced soft error rates.

Table 1 shows the sensitivity of a soft error rate (SER) failure in time (FIT) to various implant options, while Table 2 shows how FIT is improved by changing the junction capacitance and funnel length.

TABLE 1

| Implant Name | N + SD counter Implant | P-well Implant | N-well Implant | 2P + SD Implant | PMOS Channel Implant | P + SD counter implant |
|---|---|---|---|---|---|---|
| Change of SER FIT/Mbit | 47.1 | 17.9 | 10.36 | 8.26 | 5.45 | 3.69 |

TABLE 2

| Process Option | SER FIT/Mbit control | SER FIT/Mbit W/Options | Reduction Ratio | Qcrit increase |
|---|---|---|---|---|
| Junction Cap | 205-211 | 39-48 | 4.2x-5.4x | 3% |
| LiCap | 37-47 | 39-48 | 4x-7.5x | 10% |

It is to be noted that there are other methods for improving the SER FIT rate for SRAM cell or latches, such as by (1) adding capacitance using a back end capacitor; (2) increasing the cell size of SRAM cell or latches; (3) using a deep N-well (may require a special tool or may yield a low through put); and (4) using an SOI or epitaxial substrate. Compared to the aforementioned alternative methods, embodiments of the present invention are relatively easy to integrate with existing processes. For example, the above-described counter doping may be realized by adding additional implant steps to an existing process. A counter doping implant may also be performed right before or after a source/drain implant to save on masking steps.

Figure 1:
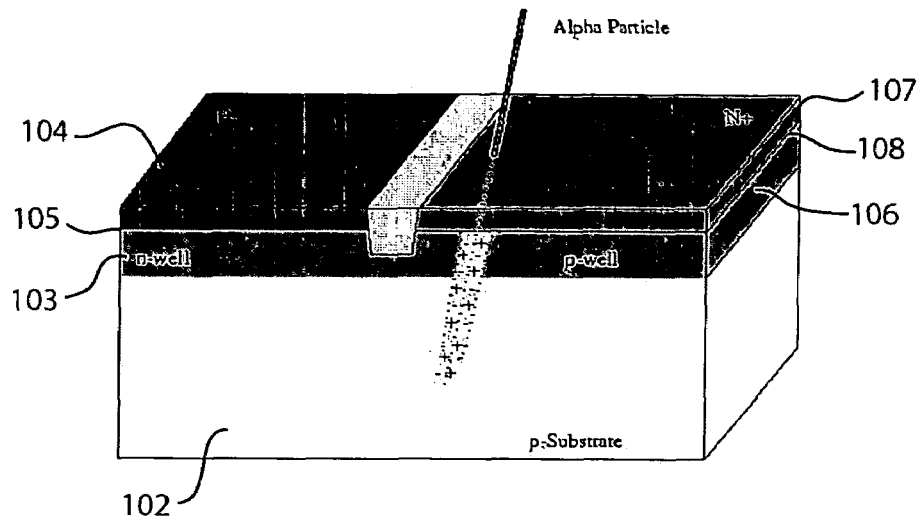
FIG. 1 shows a schematic diagram of a cross-section of a P-type metal oxide semiconductor (PMOS) transistor and an N-type metal oxide semiconductor (NMOS) transistor.
Figure 3:
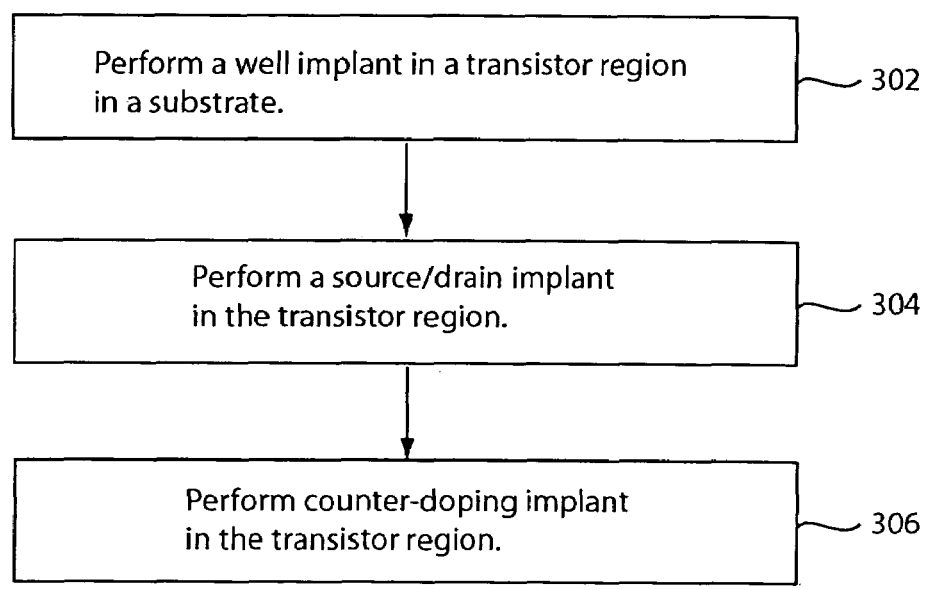
FIG. 3 shows a flow diagram of a method of fabricating a transistor for a memory cell in accordance with an embodiment of the present invention.

FIG. 3 shows a flow diagram of a method of fabricating a MOS transistor for a memory cell in accordance with an embodiment of the present invention. In step 302, a dopant is implanted in a substrate (e.g., silicon substrate) to form a well in a transistor region. For example, the dopant may be a P-type dopant, such as boron, to form a P-well in an NMOS transistor region.

In step 304, a dopant is implanted in the substrate to form a highly doped region (i.e., P+ or N+ region), such as source/drain regions. For example, the dopant for the source/drain implant may be an N-type dopant, such as arsenic, to form N+ source/drain regions in the NMOS transistor region.

In step 306, a counter doping implant is performed in the transistor region. As its name implies, the counter doping implant involves the implantation of a dopant having a type opposite to that of the source/drain implant. For example, in the case of an NMOS transistor region implanted with an N-type dopant to create source/drain regions, the counter doping implant involves implantation of a P-type dopant. In one embodiment where arsenic is implanted in the substrate to create source/drain regions, a boron counter doping implant is performed. The counter doping implant may comprise one or more implantation steps performed right before or after the source/drain implant to minimize masking steps. For example, the counter doping implant may employ the same mask as the source/drain implant. The counter doping implant may comprise one or more implantation steps that move the metallurgical junction formed by the well implant and source/drain implant closer to the surface of the substrate and/or increase the concentration of the dopant of the well implant. Advantageously, the counter doping implant increases the metallurgical junction capacitance and reduces funnel length to minimize soft errors in a memory cell where the transistor being fabricated is employed.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating an NMOS transistor for a memory cell, the method comprising:
   forming a P-well in an NMOS transistor region in a substrate, the P-well being doped with a P-type dopant;
   forming an N+ region in the NMOS transistor region, the N+ region being doped with an N-type dopant, the P-well and N+ region forming an N+/P-well junction at a first depth in the substrate; and
   implanting a P-type dopant in the NMOS transistor region to move the N+/P-well junction to a second depth that is shallower than the first depth.

2. The method of claim 1 wherein the P-type dopant of the P-well and the P-type dopant implanted to move the N+/P-well junction to the second depth comprise boron.

3. The method of claim 1 wherein the N-type dopant of the N+ region comprises arsenic.

4. The method of claim 1 wherein the N+ region comprises a source region.

5. A method of fabricating a transistor, the method comprising:
   performing a well implant using a first dopant to form a well in a transistor region in a substrate;
   performing an implant using a second dopant to form a highly doped region in the transistor region, the well and the highly doped region forming a metallurgical junction at a first depth in the substrate; and
   performing a counter doping implant using a third dopant to increase a capacitance of the metallurgical junction.

6. The method of claim 5 wherein the first dopant and the third dopant are P-type dopants and the second dopant is an N-type dopant.

7. The method of claim 5 wherein the counter doping implant is performed before the implant of the second dopant.

8. The method of claim 5 wherein the counter doping implant is performed after the implant of the second dopant.

9. The method of claim 5 wherein the counter doping implant and the implant of the second dopant are performed using a same mask.

10. The method of claim 5 wherein the highly doped region comprises source/drain regions.

* * * * *